United States Patent
Wang et al.

(10) Patent No.: US 9,669,426 B2
(45) Date of Patent: Jun. 6, 2017

(54) HEAT CONDUCTIVE ADHESIVE FILM, METHOD FOR MANUFACTURING THE SAME AND OLED PANEL

(71) Applicants: BOE HYUNDAI LCD INC., Beijing (CN); BOE TECHNOLOGY GROUP CO., LTD., Beijing (CN)

(72) Inventors: Quanzhong Wang, Beijing (CN); Zhenhua Gu, Beijing (CN); Moyu Zhu, Beijing (CN)

(73) Assignees: BOE HYUNDAI LCD INC., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 449 days.

(21) Appl. No.: 14/345,815

(22) PCT Filed: Sep. 17, 2013

(86) PCT No.: PCT/CN2013/083598
§ 371 (c)(1),
(2) Date: Mar. 19, 2014

(87) PCT Pub. No.: WO2014/183361
PCT Pub. Date: Nov. 20, 2014

(65) Prior Publication Data
US 2014/0342117 A1    Nov. 20, 2014

(30) Foreign Application Priority Data
May 14, 2013  (CN) .......................... 2013 1 0177430

(51) Int. Cl.
*H01L 51/52*   (2006.01)
*H01L 27/32*   (2006.01)
(Continued)

(52) U.S. Cl.
CPC .......... *B05D 3/0406* (2013.01); *B05D 1/002* (2013.01); *B05D 1/02* (2013.01); *B05D 1/26* (2013.01);
(Continued)

(58) Field of Classification Search
CPC ............... H01L 51/529; H01L 27/3244; Y10T 428/24149; Y10T 428/24479;
(Continued)

(56) References Cited

U.S. PATENT DOCUMENTS 4,606,962 A *  8/1986  Reylek ........................ C09J 7/00
                                                    156/250
5,958,512 A *  9/1999  Krish ....................... B05C 11/06
                                                    427/338
6,770,240 B1 * 8/2004  Laird ..................... D06C 23/04
                                                    26/2 R

FOREIGN PATENT DOCUMENTS

CA    2877863 A1 *  1/2014  ............. C08G 59/56
CN    2582180 Y      10/2003
(Continued)

OTHER PUBLICATIONS

International Preliminary Report on Patentability Appln. No. PCT/CN2013/083598; Dated Nov. 17, 2015.
(Continued)

*Primary Examiner* — William Phillip Fletcher, III
(74) *Attorney, Agent, or Firm* — Ladas & Parry LLP

(57) ABSTRACT

A method for manufacturing a heat conductive adhesive film includes: forming a non-solid heat conductive adhesive layer with cured particles on a substrate; forming several bumps on the non-solid heat conductive adhesive layer while performing curing, so as to yield the heat conductive adhesive film with several bumps. A heat conductive adhesive film and an OLED panel are provided. Several bumps are formed on a flat surface of the heat conductive adhesive film, thus
(Continued)

increasing the surface area of the heat conductive adhesive film such that heat from the heat generating unit can be duly discharged.

15 Claims, 4 Drawing Sheets

(51) Int. Cl.
| | |
|---|---|
| *B05D 3/04* | (2006.01) |
| *B05D 5/02* | (2006.01) |
| *G09G 3/3208* | (2016.01) |
| *B05D 1/26* | (2006.01) |
| *B05D 1/00* | (2006.01) |
| *B05D 5/10* | (2006.01) |
| *B05D 3/06* | (2006.01) |
| *B05D 1/02* | (2006.01) |
| *C09J 9/02* | (2006.01) |

(52) U.S. Cl.
CPC ............. *B05D 3/067* (2013.01); *B05D 5/10* (2013.01); *C09J 9/02* (2013.01); *G09G 3/3208* (2013.01); *H01L 27/3244* (2013.01); *H01L 51/529* (2013.01); *B05D 2502/00* (2013.01); *B32B 2457/206* (2013.01); *G09G 2300/06* (2013.01); *Y10T 428/24149* (2015.01); *Y10T 428/24479* (2015.01); *Y10T 428/24612* (2015.01)

(58) Field of Classification Search
CPC ............. G09G 3/3208; G09G 2300/06; B32B 2457/206; B05D 1/002; B05D 1/02; B05D 1/26; B05D 3/0406; B05D 3/067; B05D 5/10; B05D 2502/00; C09J 9/02
USPC ........ 427/207.1, 558, 64; 428/156, 172, 116
See application file for complete search history.

(56) References Cited

FOREIGN PATENT DOCUMENTS

| | | |
|---|---|---|
| WO | 00/59715 A1 | 10/2000 |
| WO | 2010/131156 A1 | 11/2010 |

OTHER PUBLICATIONS

International Search Report issued Jan. 17, 2014; PCT/CN2013/083598.
First Chinese Office Action dated May 26, 2014; Appln. No. 201310177430.6.
Third Chinese Office Action Appln. No. 201310177430.6; Dated Nov. 15, 2014.

* cited by examiner

HEAT CONDUCTIVE ADHESIVE FILM, METHOD FOR MANUFACTURING THE SAME AND OLED PANEL

BACKGROUND

Embodiments of the present invention relate to a heat conductive adhesive film, a method for manufacturing the same, and an OLED panel.

In conventional technology, the problem for an Organic Light-Emitting Diode (OLED) is that the OLED is readily subjected to photochromic degradation per se. One reason is that the OLED emits light per se, which causes great heat on the backplate and thus it's necessary to duly dissipate heat. Common OLED adopts air cooling at its back side, or alternatively is coated with flat heat conductive adhesive on the back side for heat dissipation, however, these manners are not yet sufficient to reach the effect of timely heat dissipation. That is to say, the OLED still has the problem that photochromic degradation occurs after a long time operation.

Due to timely heat dissipation can not be reached, the luminescent materials within the OLED age rapidly, thereby shortening the life of OLED.

SUMMARY

One embodiment of the present invention provides a method for manufacturing a heat conductive adhesive film, comprising forming a non-solid heat conductive adhesive layer comprising cured particles on a substrate; forming several bumps on the non-solid heat conductive adhesive layer while performing curing, so as to yield the heat conductive adhesive film with several bumps.

For example, in this method, a surface of the substrate is coated with a non-solid heat conductive adhesive layer with cured particles, such that the non-solid heat conductive adhesive layer with cured particles is created on the substrate.

For example, in this method, the step of forming several bumps on the non-solid heat conductive adhesive layer while performing curing comprises: the non-solid heat conductive adhesive layer is hitted by airflows from several spray nozzles to deform the heat conductive adhesive in such a way that bumps are yield around the position hitted by the airflows, and hitting by the airflows is maintained while performing curing so that the heat conductive adhesive film with several bumps is formed.

For example, in this method, the pressures created by the gases ejected respectively from the several spray nozzles upon the non-solid heat conductive adhesive layer are equal in their magnitude.

For example, in this method, the step of forming several bumps on the non-solid heat conductive adhesive layer while performing curing comprises: placing a transparent mask plate with several pores over the non-solid heat conductive adhesive layer; hitting the non-solid heat conductive adhesive layer with the airflow ejected by spray nozzles and through each pores to deform the heat conductive adhesive in such a way that the bumps are yielded around the position hitted by the airflows, and hitting by the airflows is maintained while performing curing so that a heat conductive adhesive film with several bumps is formed.

For example, in this method, the facing distance between the transparent mask plate and the heat conductive adhesive layer is 1~3 times the thickness of the heat conductive adhesive.

For example, in this method, the several pores in the transparent mask plate assume a honeycombed array of pores.

For example, in this method, the process, in which airflows ejected from the spray nozzles pass through each pore and hit the non-solid heat conductive adhesive layer so as to deform the non-solid heat conductive adhesive, further comprises controlling the magnitude of the airflow so that each airflow from each pore in the transparent mask plate creates equal pressure on the non-solid heat conductive adhesive layer.

For example, in this method, the process, in which airflows ejected from the spray nozzles pass through each pore and hit the non-solid heat conductive adhesive layer so as to deform the non-solid heat conductive adhesive, further comprises controlling the magnitude of the airflow as well as the distance between the transparent mask plate and the heat conductive adhesive layer to regulate the shape of the bumps.

For example, in this method, the cured particles are UV cured particles, and UV-light is adopted for irradiating the non-solid heat conductive adhesive in preset time to cure the particles.

For example, in this method, the preset time is 2~4 seconds.

For example, in this method, the substrate is an OLED panel, a shady face of the OLED panel is provided with the non-solid heat conductive adhesive layer with the cured particles.

Another embodiment of the present invention also provides a heat conductive adhesive film, a surface of which is provided with several bumps.

For example, in such a heat conductive adhesive film, the several bumps and the heat conductive adhesive film are integrally formed.

For example, in such a heat conductive adhesive film, the several bumps assume a honeycombed array.

Yet another embodiment of the present invention also provides an OLED panel, a shady face of which is provided with any one of the above heat conductive adhesive film.

The embodiment of present invention, by forming several bumps on the flat surface of the heat conductive adhesive film, increases the surface area of the heat conductive adhesive film and thereby can timely dissipate the heat emit from the heat generating unit, which, for the OLED panel, cures the effect of accelerated aging of the OLED panel due to heat accumulation, thus improves the life of OLED; and at the same time, solves the problem of photochromic degradation of the OLED.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

One embodiment of the present invention provides a method for manufacturing a heat conductive adhesive film, comprising the following steps.

Figure 1:
FIG. 1 is a schematic view illustrating how to coat a substrate with a non-solid heat conductive adhesive layer in a method for manufacturing a heat conductive adhesive film according to an embodiment of present invention.

Step one, forming a non-solid heat conductive adhesive layer with cured particles on a substrate. For example, as shown in FIG. 1, the flat surface of the substrate 1 is coated with non-solid heat conductive adhesive 3 (for example, silica gel, acrylic gel, glue including benzene polymers, polyester and similar colloid materials) with cured particles using a coating apparatus 2. The coating manner is not limited to that shown in FIG. 1, but may also be the manners, such as spray nozzle coating, sprinkle coating or spin coating and the like. The non-solid heat conductive adhesive 3' may be liquid or viscous heat conductive adhesive. The cured particle in this embodiment may be ultraviolet light (UV) cured particle. The UV-cured particles (molecular level) are contained within ordinary transparent colloid which belongs to acrylic-type colloid material. As an example, the XS-HAL 1522 available from KYORITSU CHEMICAL & CO., LTD is a kind of transparent colloid comprising UV-cured particles therein and may be cured under irradiation of UV-light at 1500 mj/cm$^2$.

Figure 2:
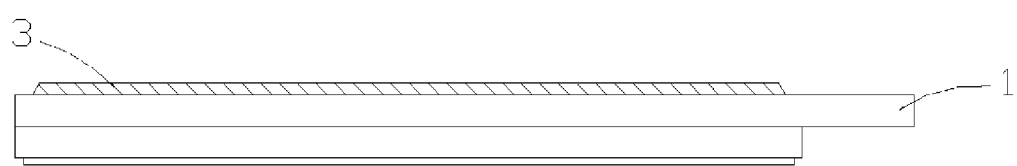
FIG. 2 is a schematic view illustrating the substrate after being coated with a non-solid heat conductive adhesive layer.
Figure 3:
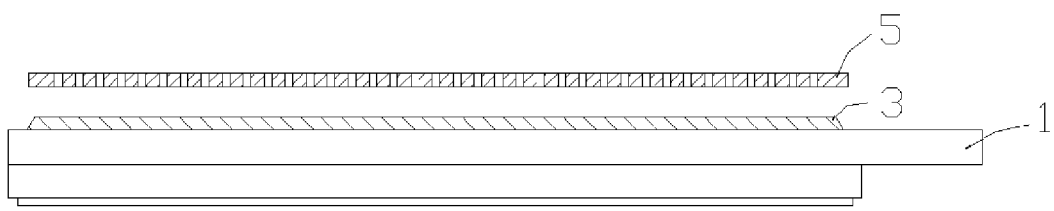
FIG. 3 is a schematic view illustrating FIG. 2 after a transparent mask plate is placed.
Figure 4:
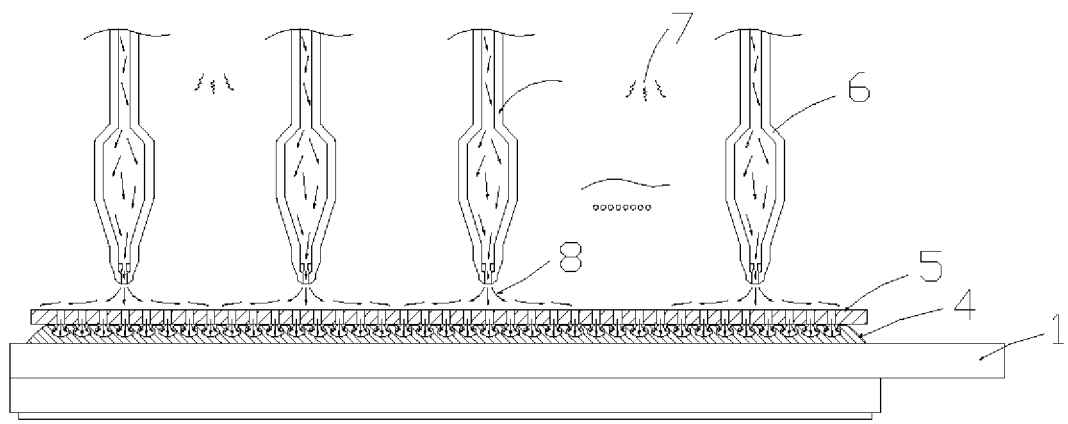
FIG. 4 is a schematic view illustrating a process of forming several bumps on a surface of a heat conductive adhesive layer.
Figure 5:
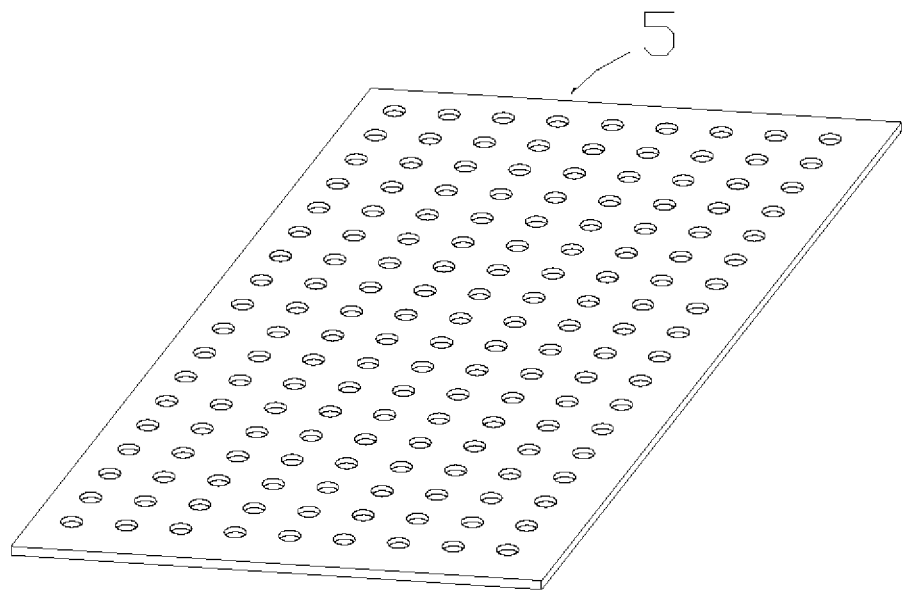
FIG. 5 is a schematic view of a transparent mask plate.
Figure 6:
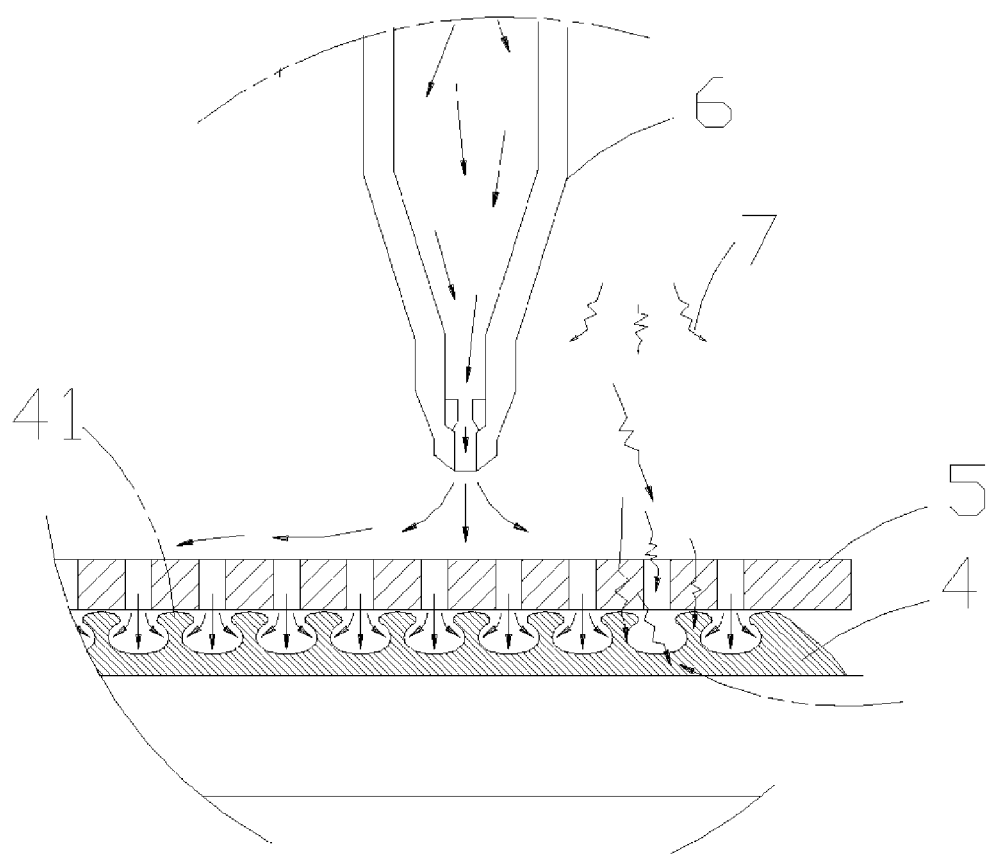
FIG. 6 is a close-up view of FIG. 4.

As shown in FIG. 2, a non-solid heat conductive adhesive layer 3 is formed after coating. The thickness of the heat conductive adhesive layer 3 is between 0.10 mm to 0.30 mm, for example 0.2 mm.

Step two, forming several bumps on the non-solid heat conductive adhesive layer 3 while performing curing, so as to yield a heat-conducting adhesive film with said several bumps.

In this embodiment, corresponding spots of the non-solid heat conductive adhesive layer are hitted by airflows from several spray nozzles to deform the non-solid heat conductive adhesive, in such a way that bumps are yielded around the positions bitted by the airflows. The hitting by airflows is maintained while performing curing so that a heat conductive adhesive film with several bumps is formed. In order for an even distribution of the several bumps, a spray nozzle array may be arranged over the heat conductive adhesive layer 3 to perform gas-spraying. For example, each of the spray nozzles may be regulated to have equal spraying pressure, so that the formed bumps are identical in their size and shapes and accordingly cause even heat dissipation.

For large-screen OLED panels or other large-area heat generating units, direct spray nozzles may be employed for air spraying and directly hitting the heat conductive adhesive layer 3 to create several bumps, however, for minor-screen OLED (such 5-inch products), it's required to form hundreds or thousands of minor and dense bump configurations, but ifs difficult to design a extremely dense spray nozzle array.

In one example, as shown in FIGS. 3, 4, 5, and 6, a transparent mask plate 5 with several pores is placed over the non-solid heat conductive adhesive layer 3, such that the airflow from the spray nozzles 6 passes each of the pores and hits the non-solid heat conductive adhesive layer 3, so as to deform the non-solid heat conductive adhesive and create the bumps 41 around the spots hitted by the airflow. During the hitting by airflow, curing is performed to create a heat conductive adhesive film 4 with several bumps 41. Specific procedure of one example is described below.

Firstly, the transparent mask plate 5 with several pores is placed over the non-solid heat conductive adhesive layer 3, and the spray nozzles 6 are arranged over the transparent mask plate 5. For example, the facing distance between the transparent mask plate 5 and the heat conductive adhesive layer 3 is 1~3 times the thickness of the heat conductive adhesive.

Then the spray nozzles 6 are turned on to start air spraying, airflow 8 passes the pores of the transparent mask plate 5 and leads to a downward impact force upon the liquid or viscous heat conductive adhesive below the pores, to make the heat conductive adhesive right below the pores depressed downwardly and thus form a dent, but the heat conductive adhesive right below and around the pores raises upwardly under the airflow impact, thus a bump 41 is formed. It's to be noted that the pressure for air spraying should be regulated to such an extent that the airflow would not breakdown entire heat conductive adhesive layer 3.

Air spraying is maintained after formation of the bump 41, that is, the shape of the bump 41 of the heat conductive adhesive layer 3 is kept while turning on the ultraviolet lamp, the UV-light 7 from the lamp is utilized to irradiate the heat conductive adhesive for 2 to 4 seconds (for example, 3 seconds) to cure the heat conductive adhesive, finally, a heat conductive adhesive film 4 with several bumps 41 is yielded.

With the heat conductive adhesive film made in the present embodiment, several bumps are formed on a originally-flat surface of the heat conductive adhesive film, thereby comparing with the heat conductive adhesive film with flat surface, the surface area of the heat conductive adhesive film is increased and thus the effect of timely heat dissipation is achieved.

In one example, In order for evenly heat dissipation, the several pores in the transparent mask plate 5 assume a honeycombed array of pores, so that, after the formation of the bumps 41, the surface of the heat conductive adhesive film 4 presents a honeycombed array formed by the several bumps 41, that is, the several bumps 41 are evenly distributed on the surface of the heat conductive adhesive film 4, and further, due to the dense honeycombed array provided by the bumps 41, the heat conductive adhesive film 4 has greater surface area, the effect of timely and evenly heat dissipation could be reached.

In one example, the process, in which airflow passes through said each pore and hits the non-solid heat conductive adhesive layer 3 so as to deform the non-solid heat conductive adhesive, may further comprise controlling the magnitude of the airflow (for example, using a pressure regulator valve of a spray nozzle) so that airflow from each pore in the transparent mask plate 5 create essentially or completely equal pressure on the non-solid heat conductive adhesive layer 3. In this embodiment, several spray nozzles 6 may be provided evenly over the transparent mask plate 5. Taking a 5-inch product as an example, hundreds of or even thousands of dense bump configurations are needed, and corresponding pores in the transparent mask plate are approximately 0.05 mm in diameter (extremely minor), while for the spray nozzles, only a 5×5 spray nozzle array (the dense spray nozzle array is no longer required) to ensure an even air spraying over the wide entire range. The transparent mask plate could ensure even air spraying from each of the pores.

For large-screen OLED or in the case where the dense bump configuration is not required, each of the pores may be provided with one spray nozzle 6 thereabove, and each of the spray nozzles 6 has equal spraying pressure. Due to the identical pressure of the airflow upon the heat conductive adhesive layer 3, each of the bumps 41 has essentially identical shape and size and an improved even heat dissipation is enabled.

Figure 7:
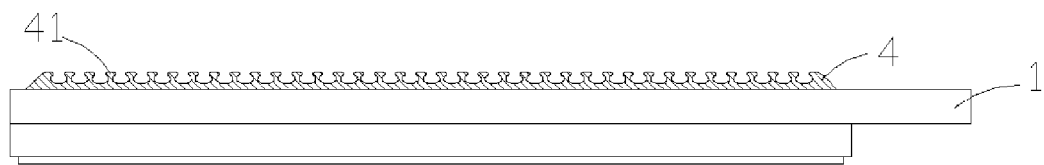
FIG. 7 is a schematic view illustrating a heat conductive adhesive film created on a shady face of an OLED panel using the manufacturing technology in a method for manufacturing a heat conductive adhesive film according to an embodiment of present invention.
Figure 8:
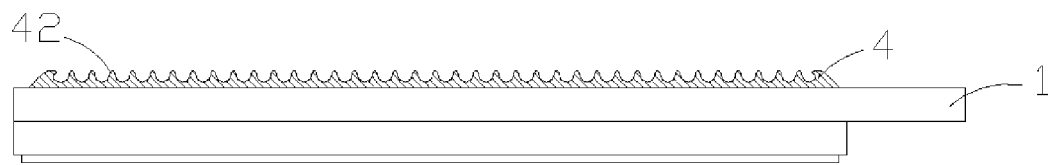
FIG. 8 is a schematic view illustrating another heat conductive adhesive film created on a shady face of an OLED panel using the manufacturing technology in a method for manufacturing a heat conductive adhesive film according to an embodiment of present invention.

In one example, it's also possible to regulate the spraying pressure and the facing distance between the transparent mask plate 5 and the heat conductive adhesive layer 3 so as to regulate the height and shape of the bumps, that is, regulate the surface area of the heat conductive adhesive film 4 to attain different effect of heat dissipation. As shown in FIGS. 7 and 8, the heat conductive adhesive films 4 with differently-shaped dumps are illustrated. In FIG. 7, the bump 41 is higher and has a spherical cap-shaped top, such that the heat conductive adhesive film 4 has a greater surface area, its possible to increase the airflow and the facing distance between the transparent mask plate 5 and the heat conductive adhesive layer 3 so as to control the formation of the bumps 41. In FIG. 8, the bump 42 is lower and its top is sharp, such that the surface area of the heat conductive adhesive film 4 is less than that of FIG. 7, it's possible to decrease the airflow and the facing distance between the transparent mask plate 5 and the heat conductive adhesive layer 3 so as to control the formation of the bumps 42.

As required, thermal airflow may be used for creating bumps in the heat conductive adhesive film, that is, the temperature of the ejected airflow is higher than the room temperature (25° C.), for example 30° C.~60° C., such a thermal airflow could soften the heat conductive adhesive film, and even facilitate the formation of the bumps in the heat conductive adhesive film. The airflow may be conveniently regulated, for example, by using resistance wire, infrared heating and so on to heat the airflow. Additionally, cold airflow may also be used for creating the bumps in the heat conductive adhesive film if required, that is the ejected airflow has a temperature lower than the room temperature (25° C.).

The heat conductive adhesive film may be peeled from the substrate after its fabrication, then cover the surface of the heat generating unit. Undoubtedly, the heat generating unit may be directly used as the substrate, and the heat conductive adhesive film is fabricated on the surface of the heat generating unit. For an OLED panel, the shady face (the face of the OLED panel opposite to the light emitting face, i.e., a heat generating face) of the OLED panel may be formed with the heat conductive adhesive film according to above methods.

The embodiment of present invention enables timely dissipation of heat originated from driving of the OLED panel, overcomes the effect of accelerated aging of OLED panel due to heat accumulation; and also further overcomes the deficiency of photochromic degradation. The embodiment of present invention also provides a heat conductive adhesive film fabricated in the above method, the surface of the heat conductive adhesive film is formed with several bumps which could be integrally formed with the heat conductive adhesive film, and for the purpose of even heat dissipation, the several bumps preferably present a honeycombed array.

The embodiment of present invention also provides an OLED panel comprising said heat conductive adhesive film formed on the shady face thereof, as shown in FIGS. 7 and 8. The surface of the heat conductive adhesive film on the shady face of the OLED panel is formed with several bumps, which increases the surface area of the heat conductive adhesive film and thereby can timely dissipate the heat originated from driving of the OLED panel, which cures the effect of accelerated aging of the OLED panel due to heat accumulation, thus improves the life of OLED; and at the same time, solves the problem of photochromic degradation of the OLED. And the better cushioning effect of the bumps may keep the OLED panel per se from being damaged.

What are described above is related to the illustrative embodiments of the disclosure only and not limitative to the scope of the disclosure; the scopes of the disclosure are defined by the accompanying claims.

What is claimed is:

1. A method for manufacturing a heat conductive adhesive film, comprising:
   forming a non-solid, heat conductive adhesive layer containing curable particles on a substrate;
   forming several bumps on the non-solid, heat conductive adhesive layer while curing said layer, thereby yielding a heat conductive adhesive film with several bumps.

2. The method according to claim 1, wherein the non-solid, heat conductive adhesive layer containing curable particles is formed by coating.

3. The method according to claim 2, wherein the forming several bumps on the non-solid, heat conductive adhesive layer while curing said layer comprises:
   directing air from several spray nozzles against the non-solid, heat conductive adhesive layer, during curing, thereby deforming the non-solid, heat conductive adhesive in such a way that the bumps are formed in an area hit by the air.

4. The method according to claim 2, wherein the forming several bumps on the non-solid, heat conductive adhesive layer while curing said layer comprises:
   placing a transparent mask plate with several pores over the non-solid, heat conductive adhesive layer;
   directing air from several spray nozzles through each of the pores and against the non-solid, heat conductive adhesive layer, during curing, thereby deforming the non-solid, heat conductive adhesive in such a way that the bumps are formed in an area hit by the air.

5. The method according to claim 1, wherein the forming several bumps on the non-solid, heat conductive adhesive layer while curing said layer comprises:
   directing air from several spray nozzles against the non-solid, heat conductive adhesive layer, during curing, thereby deforming the non-solid, heat conductive adhesive in such a way that the bumps are formed in an area hit by the air.

6. The method according to claim 5, wherein a pressure of air sprayed by each of the nozzles is equal.

7. The method according to claim 1, wherein the forming several bumps on the non-solid, heat conductive adhesive layer while curing said layer comprises:
placing a transparent mask plate with several pores over the non-solid, heat conductive adhesive layer;
directing air from several spray nozzles through each of the pores and against the non-solid, heat conductive adhesive layer, during curing, thereby deforming the non-solid, heat conductive adhesive in such a way that the bumps are formed in an area hit by the air.

8. The method according to claim 7, wherein a distance between the transparent mask plate and the non solid, heat conductive adhesive layer is 1 to 3 times the thickness of the non solid, heat conductive adhesive.

9. The method according to claim 8, wherein the several pores in the transparent mask plate are arranged in a honeycombed pattern.

10. The method according to claim 7, wherein the several pores in the transparent mask plate are arranged in a honeycombed pattern.

11. The method according to claim 7, wherein a pressure of air from each of the pores is equal.

12. The method according to claim 7, wherein a pressure of air from each of the pores and a distance between the transparent mask plate and the non solid, heat conductive adhesive layer are controlled so as to control the shape of the bumps.

13. The method according to claim 1, wherein the curable particles are UV-curable particles and the non-solid, heat conductive adhesive is irradiated with UV-light to cure the particles.

14. The method according to claim 13, wherein the non-solid, heat conductive adhesive is irradiated with UV light from approximately 2 seconds to approximately 4 seconds.

15. The method according to claim 1, wherein the substrate is an OLED panel and a face opposite a light-emitting face of the OLED panel is provided with the non-solid, heat conductive adhesive layer containing the curable particles.

* * * * *